(12) United States Patent
Chang et al.

(10) Patent No.: US 8,463,205 B2
(45) Date of Patent: Jun. 11, 2013

(54) TRANSMITTING APPARATUS OPERATIVE AT A PLURALITY OF DIFFERENT BANDS AND ASSOCIATED METHOD

(75) Inventors: Hsu-Hung Chang, Hsinchu Hsien (TW); Fucheng Wang, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 176 days.

(21) Appl. No.: 12/942,100

(22) Filed: Nov. 9, 2010

(65) Prior Publication Data

US 2011/0116586 A1    May 19, 2011

(30) Foreign Application Priority Data

Nov. 17, 2009  (TW) .............................. 98138951 A

(51) Int. Cl.
 *H01Q 11/12*  (2006.01)
(52) U.S. Cl.
 USPC ............. 455/118; 455/102; 455/103; 331/2; 331/18

(58) Field of Classification Search
 USPC ............................................ 455/118
 See application file for complete search history.

(56) References Cited

U.S. PATENT DOCUMENTS

| 6,297,703 B1* | 10/2001 | Martin et al. ................ 331/2 |
| 7,288,999 B1* | 10/2007 | Hietala et al. ............... 331/23 |
| 2004/0005869 A1* | 1/2004 | See et al. ................. 455/102 |

* cited by examiner

*Primary Examiner* — Ajibola Akinyemi
(74) *Attorney, Agent, or Firm* — Edell, Shapiro & Finnan, LLC

(57) ABSTRACT

A transmitting apparatus operative at a plurality of different bands includes at least a modulator, an intermediate frequency (IF) filter, and an offset phase-locked-loop (OPLL). Regardless at which one of the frequency bands the transmitting apparatus operates, a divisor of at least one frequency divider included within the OPLL is fixed, and a signal, which is outputted by a controllable oscillator and received by an offset mixer included within the OPLL, corresponds to a substantially fixed frequency.

2 Claims, 6 Drawing Sheets

TRANSMITTING APPARATUS OPERATIVE AT A PLURALITY OF DIFFERENT BANDS AND ASSOCIATED METHOD

CROSS REFERENCE TO RELATED PATENT APPLICATION

This patent application is based on Taiwan, R.O.C. patent application No. 098138951 filed on Nov. 17, 2009.

FIELD OF THE INVENTION

The present invention relates to a transmitting mechanism operative at a plurality of different bands, and more particularly, to a transmitting apparatus operative at a plurality of different bands and an associated method.

BACKGROUND OF THE INVENTION

A conventional transmitting apparatus operative at a plurality of different bands commonly adopts an offset phase-lock-loop (OPLL) as a substitute for a surface acoustic wave (SAW) filter to reduce noise interference. However, in order to allow the transmitting apparatus to operate at different bands, a frequency divider in a conventional OPLL is required to adopt different divisors corresponding to the different bands. Such an approach of utilizing different divisors for accommodating the different bands not only makes design of an overall circuit of the conventional transmitting apparatus more challenging, but also significantly increases production costs. For example, when a divisor utilized by a frequency divider changes along with different bands at which the transmitting apparatus operates, other related circuits, e.g., an offset mixer and a filter in the OPLL, also need to be operative under the different bands. As a result, the design of the overall circuit inevitably becomes more challenging. Further, since the divisor in the frequency divider varies the intermediate frequency, several additional analog baseband circuits are needed for processing associated signals.

SUMMARY OF THE INVENTION

To solve the issues of challenging circuit design and high production costs of the prior art, one objective of the invention is to provide a transmitting apparatus operative at a plurality of different bands and an associated method, with at least one divisor adopted by frequency dividers in the transmitting apparatus being a constant for overcoming the foregoing issues.

A transmitting apparatus operative at a plurality of different bands according to an embodiment of the invention comprises a modulator, an IF filter and an OPLL. The modulator generates a modulated signal according to an IF frequency and a baseband signal; the IF filter, coupled to the modulator, IF filters the modulated signal to generate an IF signal; and the OPLL, coupled to the IF filter and comprising a plurality of frequency dividers, generates a transmitting signal having a predetermined transmitting frequency according to the IF signal. Divisors of the plurality of frequency dividers are constants.

A method for a transmitting apparatus operative at a plurality of different bands according to an embodiment of the invention comprises generating a modulated signal according to an IF frequency and a baseband signal, IF filtering the modulated signal to generate an IF signal, and performing an OPLL operation on the IF signal to generate a transmitting signal having a predetermined transmitting frequency. Divisors of a plurality of frequency-dividing operations in the OPLL operation are constants.

One advantage of the embodiments of the invention is that, divisors adopted by one or more frequency dividers in the OPLL in the transmitting apparatus are constants, so that design complexity of an overall circuit as well as production costs are significantly reduced.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF THE PREFERRED EMBODIMENT

Figure 1:
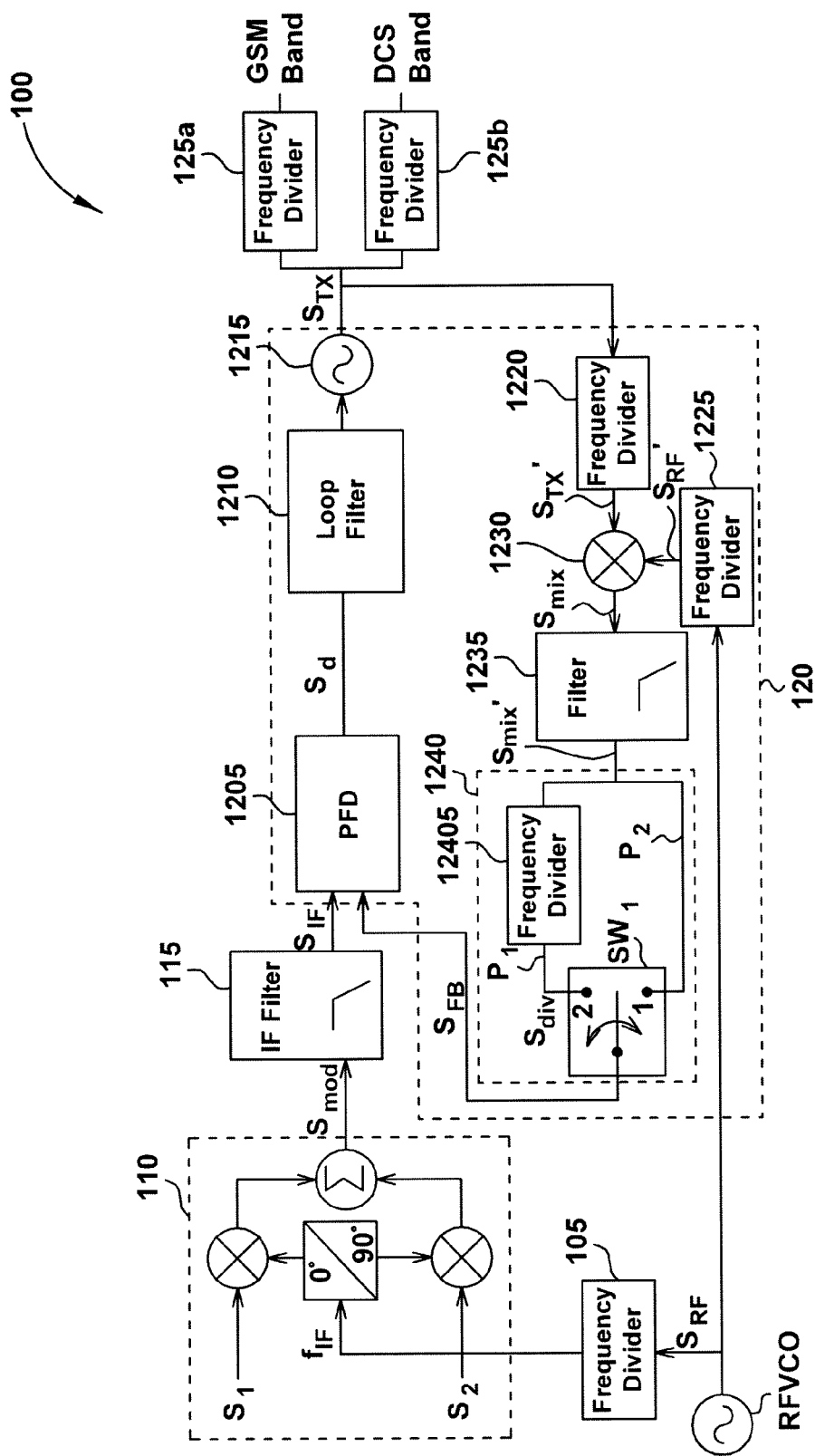
FIG. 1 is a circuit schematic diagram of a transmitting apparatus according to a first embodiment of the invention.

FIG. 1 shows a schematic diagram of a transmitting apparatus 100 according to a first embodiment of the invention. The transmitting apparatus 100 is operative at a plurality of different bands (e.g., a first band and a second band), and comprises a frequency divider 105, a quadrature modulator 110, an intermediate frequency (IF) filter 115, an offset phase-locked loop (OPLL) 120, and frequency dividers 125$a$ and 125$b$. For example, the first band is a Global System for Mobile (GSM) band compliant to GSM communication systems, and the second band is a Digital Communication System (DCS) band compliant to DCS. The quadrature modulator 110, coupled to the frequency divider 105 and the IF filter 115, generates a modulated signal $S_{mod}$ according to an IF frequency $f_{IF}$ and two baseband signals $S_1$ and $S_2$. The IF frequency $f_{IF}$, which is 120 MHz in this embodiment for example, is generated by the frequency divider 105 from frequency-dividing a radio frequency (RF) oscillation signal $S_{RF}$ having a predetermined RF frequency according to a divisor $P_{105}$. The divisor $P_{105}$ is associated with the plurality of different bands and is a constant. The RF oscillation signal $S_{RF}$ is from an RF oscillator RFVCO at a receiving terminal, and the RF oscillator RFVCO is capable of generating signals of a predetermine frequency range in cooperation with the transmitting apparatus 100 operative at different bands. The IF filter 105 performs IF signal filtering on the modulated signal $S_{mod}$ to generate an IF signal $S_{IF}$. In practice, to realize the IF filter 115, a low-pass filter may be used to remove high-frequency harmonic components, with its corner frequency falling around the frequency of the IF signal $S_{IF}$ generated. The OPLL 120 comprises a phase frequency detector (PFD) 1205, a loop filter 1210, a controllable oscillator 1215, frequency dividers 1220 and 1225, an offset mixer 1230, a filter 1235 and a frequency dividing circuit 1240. Since the OPLL 120 renders an effect similar to a band-pass filter on signals that pass through, noise apart from the IF signal $S_{IF}$ are removed so that the transmitting apparatus 100 needs no external or internal SAW filter. The phase frequency detector 1205 compares the IF signal $S_{IF}$ and a feedback signal $S_{FB}$ to generate a phase-different signal $S_d$, according to which the controllable oscillator 1215 generates a transmitting signal $S_{TX}$ having a predetermined transmitting frequency. That is, with the processing of the controllable oscillator 1215, the transmitting signal $S_{TX}$ in a high frequency (e.g., a high frequency of 3.6 GHz) is generated from the IF signal $S_{IF}$. Therefore, for GSM and DCS bands, the frequency dividers 125a and 125b respectively adopting divisors $P_{125a}$ and $P_{125b}$ are applied to obtain signals respectively having a center frequency of around 900 MHz and 1.8 GHz. The divisor $P_{125a}$ is a constant 4, and the divisor $P_{125b}$ is a constant 2. In equivalence, the frequency dividers 1220 and 1225, the offset mixer 1230, the filter 1235 and the frequency dividing circuit 1240 form a feedback signal generating circuit. The feedback signal generating circuit is coupled to the controllable oscillator 1215 and the phase frequency detector 1205 to generate the feedback signal $S_{FB}$ by selectively frequency dividing the transmitting signal $S_{TX}$ when the transmitting apparatus 100 operates under a plurality of different bands.

The frequency divider 1220, coupled to an output end of the controllable oscillator 1215, frequency-divides the transmitting signal $S_{TX}$ according to a divisor $P_{1220}$ (2 in this embodiment) to generate a frequency-divided transmitting signal $S_{TX}'$; the frequency divider 1225 frequency divides the RF oscillation signal $S_{RF}$ according to a divisor $P_{1225}$ (2 in this embodiment) to generate a frequency-divided RF oscillation signal $S_{RF}'$; and the offset mixer 1230 frequency mixes the frequency-divided transmitting signal $S_{TX}'$ and the frequency-divided RF oscillation signal $S_{RF}'$ to generate a frequency-mixed signal $S_{mix}$. The divisors $P_{1220}$ and $P_{1225}$ of the frequency dividers 1220 and 1225 in the OPLL 120 are associated with the plurality of different bands, and both are constants 2. Further, the foregoing divisors $P_{125a}$ and $P_{125b}$ are both designed as constants. Therefore, an overall circuit design is made easier to realize with relatively low production costs. The filter 1235, a low-pass filter, filters the frequency-mixed signal $S_{mix}$ outputted from the offset mixer 1230 to remove high-frequency harmonic noises resulting from frequency mixing to generate a filtered frequency-mixed signal $S_{mix}'$. Then the frequency dividing circuit 1240 selectively frequency divides the filtered frequency-mixed signal $S_{mix}'$ according to the plurality of different bands at which the transmitting apparatus 100 operates to generate the feedback signal $S_{FB}$. More specifically, "selectively frequency dividing" provides that, when the transmitting apparatus 100 operates at a first band (i.e., GSM band), the frequency dividing circuit 1240 frequency divides the filtered frequency-mixed signal $S_{mix}'$ according to a divisor (2 in this embodiment) to obtain a frequency-divided frequency-mixed signal $S_{div}$ as the feedback signal $S_{FB}$, which is then outputted to the phase frequency detector 1205; when the transmitting apparatus 100 operates at a second band (i.e., DCS band), the frequency dividing circuit 1240 directly outputs the filtered frequency-mixed signal $S_{mix}'$ as the feedback signal $S_{FB}$, which is then outputted to the phase frequency detector 1205. Since the filter 1235 precedent to the frequency dividing circuit 1240 is for removing high-frequency harmonic noise resulting from frequency mixing, the frequency dividing circuit 1240 is regarded as equivalently selectively frequency dividing the frequency-mixed signal $S_{mix}$ to generate the feedback signal $S_{FB}$. Alternatively, the filter 1235 is an optional component. That is, in another embodiment of the invention, the filter 1235 is excluded, and the frequency dividing circuit 1240 directly selectively frequency divides the frequency-mixed signal $S_{mix}$ to generate the feedback signal $S_{FB}$. In practice, according to this embodiment, the frequency dividing circuit 1240 comprises a first signal path $P_1$, a second signal path $P_2$ and a switch $SW_1$. As shown in FIG. 1, the first path $P_1$ comprises a first frequency divider 12405, which frequency divides the filtered frequency-mixed signal $S_{mix}'$ according to its divisor $P_{12405}$ (2 in this embodiment) to generate the frequency-divided frequency-mixed signal $S_{div}$. The second signal path $P_2$ directly forwards the filtered frequency-mixed signal $S_{mix}'$ to the switch $SW_1$. The switch $SW_1$ is coupled to the first and second paths $P_1$ and $P_2$, and selects a signal outputted from either of the first and second paths $P_1$ and $P_2$ as an output signal from the switch $SW_1$, i.e., the feedback signal $S_{FB}$. For example, when the transmitting apparatus 100 operates at the GSM band, the switch $SW_1$ couples the first signal path $P_1$ to the phase frequency detector 1205 to output the frequency-divided frequency-mixed signal $S_{div}$ as the feedback signal $S_{FB}$; when the transmitting apparatus 100 operates at the DCS band, the switch $SW_1$ couples the second path $P_2$ to the phase frequency detector 1205 to output the filtered frequency-mixed signal $S_{mix}'$ as the feedback signal $S_{FB}$.

With the design of the frequency dividing circuit 1240, taking the transmitting apparatus 100 operating at the DCS band as an example, the signal outputted by the frequency divider 1220 has a frequency of 1.8 GHz provided that the transmitting signal has a frequency of 3.6 GHz. At this point, signals generated at the RF oscillator RFVCO at the receiving terminal have a frequency of 3840 MHz (3.6 GHZ+240 MHz) or 3360 MHz (3.6 GHz−240 MHz). Thus, the frequency divider 1225 frequency divides the signal having a frequency of 3840 MHz or 3360 MHz by the divisor $P_{1225}$ (2) to generate a signal having a frequency of 1920 MHz or 1680 MHz. The offset mixer 1230 then frequency mixes the output signal having a frequency of 1800 MHz from the frequency divider 1220 and the output signal from the frequency divider 1225 to generate the frequency-mixed signal $S_{mix}$ having a frequency of 120 MHz. When operating at the DCS band, the corner frequency of frequency resonance of the filter 1235 is 120 MHz, with which the filter 1235 removes the high-frequency noises. The frequency dividing circuit 1240 couples the second signal path $P_2$ with the phase frequency detector 1205 to output the filtered frequency-mixed signal $S_{mix}'$ as the feedback signal $S_{FB}$. Therefore, the corner frequency of frequency resonance of the IF filter 115 is required to be around 120 MHz.

When the transmitting apparatus 100 operates at the GSM band, to maintain the corner frequency of the IF filter 115 in order to reduce circuit complexity of the IF 115, signals generated by the RF oscillator RFVCO at the receiving terminal are designed to have a frequency of 4080 MHz (3.6 GHz+480 MHz) or 3120 MHz (3.6 GHz−480 MHz) in response. Thus, the frequency divider 1225 frequency divides the signal having a frequency of 4080 MHz or 3120 MHz by the divisor $P_{1225}$ (2) to generate a signal having a frequency of 2040 MHz or 1560 MHz. The offset mixer 1230 then frequency mixes the output signal having a frequency of 1800 MHz from the frequency divider 1220 and the output signal from the frequency divider 1225 to generate the frequency-mixed signal $S_{mix}$ having a frequency of 240 MHz. When operating at the GSM band, the corner frequency of frequency resonance of the filter 1235 is 240 MHz, with which the filter 1235 removes the high-frequency noise. The frequency dividing circuit 1240 couples the first signal path $P_1$ with the phase frequency detector 1205, and thus the feedback signal $S_{FB}$ is a signal having a frequency of 120 MHz obtained from the frequency divider 12405 frequency dividing the filtered frequency-mixed signal $S_{mix}'$ by a divisor constant 2.

Therefore, as far as the phase frequency detector 1205, regardless of the transmitting apparatus 100 operating at the GSM or DCS band, the signals received from the IF filter and the frequency dividing circuit 1240 both have a frequency of 120 MHz to facilitate simple and normal operations of the phase frequency detector 1205. Substantially, the design of the IF filter 115 need not change along with the operating band (e.g., GSM or DCS band) of the transmitting apparatus 100.

It is to be noted that, in this embodiment, the divisors $P_{1220}$ $P_{1225}$ and $P_{125b}$ are the same (i.e., 2). When operating at the GSM band, an overall feedback path of the OPLL 120 frequency divides the high-frequency transmitting frequency $S_{TX}$ generated by the controllable oscillator 1215 twice by a divisor of 2. Therefore, the signal generated by the frequency divider 125a has a frequency range and a band compliant to the GSM specifications, meaning that the transmitting apparatus 100 is capable of maintaining normal operations at the GSM band. Further, when operating at the GSM band, the signal generated by the RF oscillator at the receiving terminal has a frequency of 4080 MHz or 3120 MHz, and the signal generated by the controllable oscillator 1215 is 3600; that is, in the circuit design of the first embodiment, the signals generated by the RF oscillator RFVCO at the receiving terminal and the controllable oscillator 1215 may be separated to further prevent frequency interference. It is also worth noticing that the divisor of the frequency divider 105 is a constant whether the transmitting apparatus 100 operates at the GSM band or the DCS band.

As a modification, in other embodiments, the switch $SW_1$ in the frequency dividing circuit 1240 may also be placed between the first and second paths $P_1$ and $P_2$ and the filter 1235, to selectively transmit the filtered frequency-mixed signal to the first path $P_1$ or the second path $P_2$ via the switch $SW_1$. Such modification, which achieves the object of selective frequency dividing the frequency-mixed signal $S_{mix}$, is also encompassed by the scope of the invention. In other embodiments, modulators of other forms may also be implemented to replace the quadrature modulator 110. Further, to adapt to the nature of the modulator implemented, the modulation may be performed based on the IF frequency $f_{IF}$ and one baseband signal ($S_1$ or $S_2$); that is, the modulated signal $S_{mod}$ is generated from the IF frequency $f_{IF}$ and at least one baseband signal.

Figure 2:
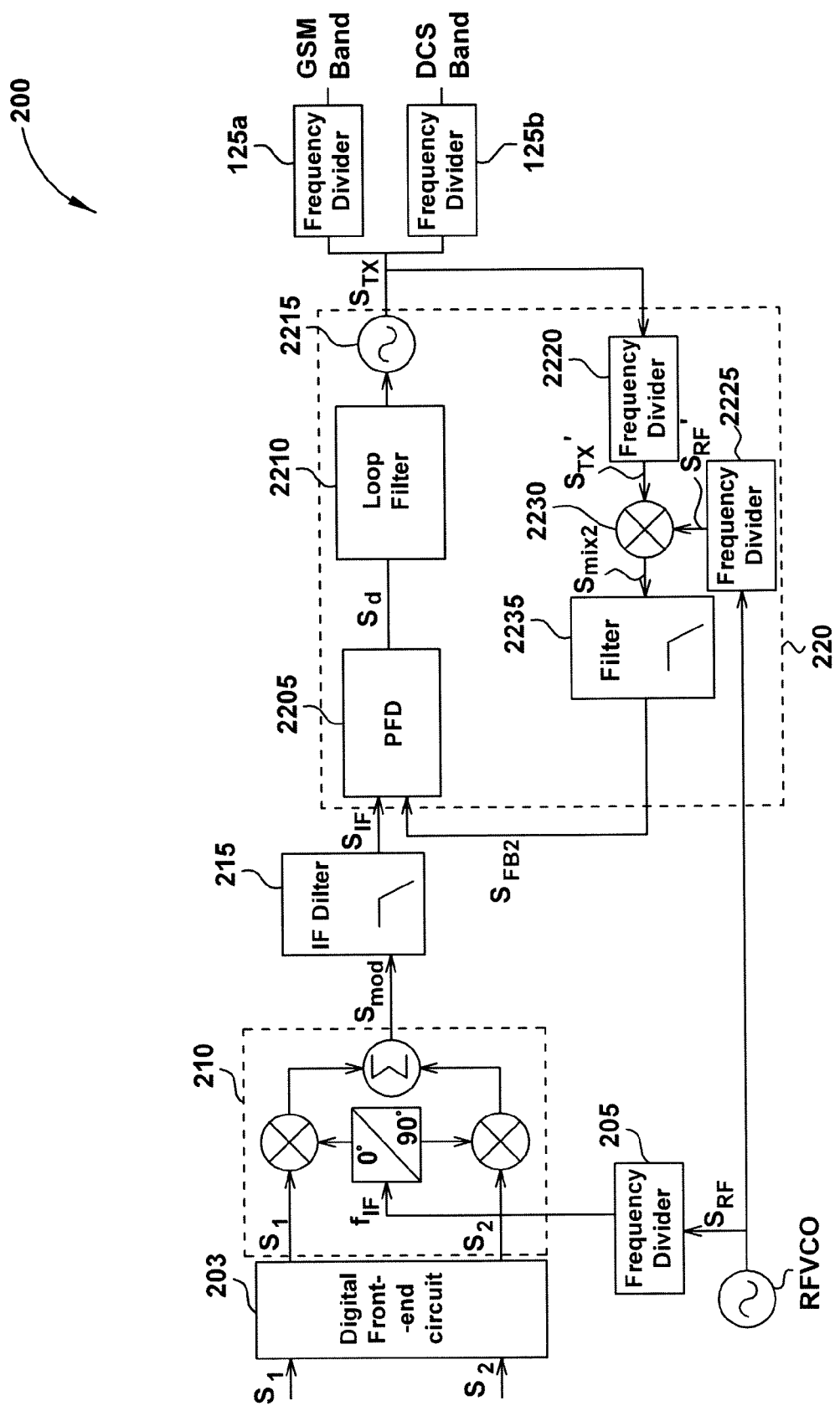
FIG. 2 is a circuit schematic diagram of a transmitting apparatus according to a second embodiment of the invention.

FIG. 2 shows a schematic diagram of a transmitting apparatus 200 according to a second embodiment of the invention. The transmitting apparatus 200 comprises a digital front-end circuit 203, a frequency divider 205, a quadrature modulator 210, an IF filter 215, an OPLL 220, and frequency dividers 125a and 125b. The digital front-end circuit 203 receives at least one baseband signal. In this embodiment, two baseband signals $S_1$ and $S_2$ are involved; however, other types of modulators may be implemented to replace the quadrature modulator 210, and hence one or more basebands may be received depending on the nature of the modulator implemented. In this embodiment, after receiving the baseband signals $S_1$ and $S_2$, the digital front-end circuit 203 selectively adjusts spectrums of the baseband signals $S_1$ and $S_2$, with details to be described shortly. Operation details of the frequency divider 205, the quadrature 210, and the frequency dividers 125a and 125b are similar to those of the corresponding elements of the first embodiment shown in FIG. 1, and description therefore shall be omitted for brevity. It is to be noted that, in this embodiment, the corner frequency of frequency resonance of the IF filter 215 is designed to be 60 MHz but not 120 MHz of the IF filter 115 shown in FIG. 1. Therefore, at this point, the frequency of the IF signal $S_{IF}$ is then 60 MHz. The OPLL 220 comprises a phase frequency detector (PFD) 2205, a loop filter 2210, a controllable oscillator 2215, frequency dividers 2220 and 2225, an offset mixer 2230, and a filter 2235. Operation details of the phase frequency detector 2205, the loop filter 2210, the controllable oscillator 2215, the offset 2230 and the filter 2235 are similar to those of the corresponding elements of the first embodiment shown in FIG. 1, and description therefore shall be omitted for brevity.

A major difference between the first and second embodiments is that, in the second embodiment, divisors of the frequency dividers 2200 and 2225 are associated with the plurality of different bands and are, instead of 2 in coordination with a divisor 2, a constant 4 in coordination with a divisor needed by the GSM band. The signals generated by the RF oscillator RFVCO at the receiving terminal having a fixed frequency of 3840 MHz (3.6 GHz+240 MHz) or 3360 MHz (3.6 GHz−240 MHz), and so the signal generated by the frequency divider 2225 has a frequency of 960 MHz or 840 MHz. In addition to the high-frequency transmitting signal of 3.6 GHz that is divided by the frequency divider 2200 by a divisor of 4, a frequency-divided transmitting signal $S_{TX}'$ having a frequency of 900 MHz is generated. Accordingly, the offset mixer 2230 outputs a frequency-mixed signal $S_{mix2}$ having a frequency of 60 MHz, which is then low-pass filtered by the filter 2235 to output a feedback signal $S_{FB}$ to the phase frequency detector 2205. As a result, when the transmitting apparatus 200 operates in the GSM band, the signal outputted by the frequency divider 125a has a frequency range and a band compliant to the GSM specifications. Therefore, when the transmitting apparatus 200 operates in the GSM band, the digital front-end circuit 203 keeps the spectrums of the baseband signals $S_1$ and $S_2$ unchanged; that is, the digital front-end circuit 203 does not adjust the spectrums of the baseband signals $S_1$ and $S_2$. However, when the transmitting apparatus 200 operates in the DCS band, in order to have frequency range and band of the signals outputted from the frequency divider 125b compliant to the DCS specifications, the digital front-end circuit 203 adjusts the spectrums of the baseband signals the baseband signals $S_1$ and $S_2$ by reducing their spectrums by a half, so that the output signals form the frequency divider 125b can be compliant to the DCS specifications while not causing any signal distortion. An advantage of such design is that, the circuit design is relatively simply, and the RF oscillator RFVCO at the receiving terminal need not generate signals of additional frequency ranges. More specifically, the RF oscillator RFVCO need not increase its tuning range. The spectrums of the baseband signals $S_1$ and $S_2$ are adjusted by adjusting their modulation indices. Taking GMSK modulation for example, a modulation parameter is adjusted from 0.5 to 0.25. The modulation parameter 0.5 means that a largest phase difference in each data interval is $\pi/2$, and the modulation parameter 0.25 means that a largest phase difference in each data interval is $\pi/4$; however, this is not to be construed as limiting the invention, as other modulation approaches and modulation parameters are within the scope of the invention.

Figure 3:
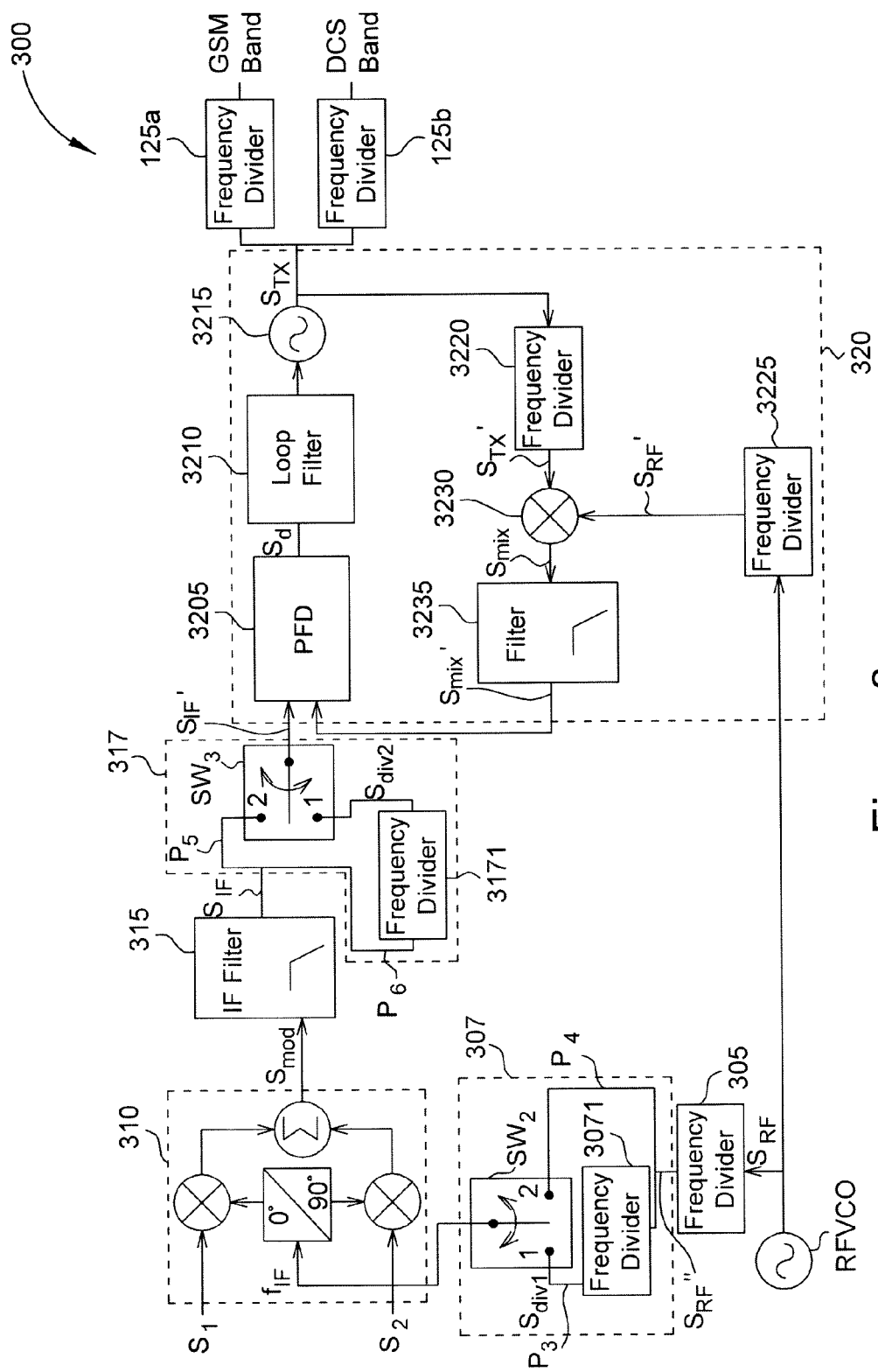
FIG. 3 is a circuit schematic diagram of a transmitting apparatus according to a third embodiment of the invention.

In another embodiment of the invention, a design of an analog circuit may be implemented to reduce signal spectrums in advance. FIG. 3 shows a schematic diagram of a transmitting apparatus 300 according to a third embodiment of the invention. The transmitting apparatus 300 comprises a frequency divider 305, a frequency dividing circuit 307, a quadrature modulator 310, an IF filter, a frequency dividing circuit 317, an OPLL 320, and frequency dividers 125a and 125b. The frequency divider 305 frequency divides an RF oscillation signal $S_{RF}$ having a predetermined RF receiving frequency according to a divisor $P_{305}$, which is 32 in this embodiment, to generate a frequency-divided RF signal $S_{RF}'''$. The frequency dividing circuit 307 selectively frequency divides the frequency-divided RF signal $S_{RF}''$ according to the plurality of different frequency bands at which the transmitting apparatus 300 operates to generate an IF frequency $f_{IF}$. The quadrature modulator 310 is coupled to the frequency dividing circuit 307, and generates a modulated signal $S_{mod}$ according to the IF frequency $f_{IF}$ and baseband signals $S_1$ and $S_2$. The IF filter 315 is coupled to the quadrature modulator 310, and IF filters the modulated signal $S_{mod}$ to generate an IF signal $S_{IF}$, as a first IF signal. The frequency dividing circuit 317 is coupled to the IF filter 315, and selectively frequency divides the IF signal $S_{IF}$ according to the plurality of different bands at which the transmitting apparatus 300 operations to generate a processed IF signal $S_{IF}'$, as a second IF signal. The OPLL 320 is coupled to the frequency dividing circuit 317, and generates a transmitting signal $S_{TX}$ having a predetermined transmitting frequency according to the processed IF signal $S_{IF}'$. Operations and functions of the frequency dividers 125a and 125b are the same as those of the corresponding elements of the first embodiment shown in FIG. 1, and shall be omitted for brevity.

The frequency dividing circuit 307 comprises a signal path $P_3$, a signal path $P_4$ and a switch $SW_2$. The signal paths $P_3$ and $P_4$ are coupled between the frequency divider 305 and the switch $SW_2$. As shown in FIG. 3, the signal path $P_3$ comprises a frequency divider 3071. The frequency divider 3071 frequency divides the frequency-divided RF signal $S_{RF}''$ according to a divisor $P_{3071}$, which is 2 in this embodiment, to generate a signal $S_{div1}$. The signal path $P_4$ directly forwards the frequency-divided RF signal $S_{RF}''$ to the subsequent switch $SW_2$. The frequency dividing circuit 317 comprises a signal path $P_5$, a signal path $P_6$ and a switch $SW_3$. The signal paths $P_5$ and $P_6$ are coupled between the IF filter 315 and the phase frequency detector 3205. As shown in FIG. 3, the signal path $P_6$ comprises a frequency divider 3171. The frequency divider 3171 frequency divides the IF signal $S_{IF}$ according to a divisor $P_{3171}$, which is associated with the plurality of different bands and is a constant 2 in this embodiment, to generate a signal $S_{div2}$. The signal path $P_5$ directly forwards the IF signal $S_{IF}$ to the subsequent switch $SW_3$. The OPLL 320 comprises a phase frequency detector 3205, a loop filter 3210, a controllable oscillator 3215, frequency dividers 3220 and 3225, an offset mixer 3230 and a filter 3235. Operations and functions of the elements in the OPLL 320 are similar to those corresponding elements in the OPLL 220 shown in FIG. 2, and descriptions therefore shall not be further discussed.

When the transmitting apparatus 300 operates at a first band, e.g., the GSM band, the switch $SW_2$ couples the signal path $P_3$ of the frequency dividing circuit 317 to the phase frequency detector 3205 to directly output the IF signal $S_{IF}$ as the signal $S_{IF}'$, which is then transmitted to the phase frequency detector 3205. When the transmitting apparatus 300 operates at a second band, e.g., the DCS band, the switch $SW_2$ couples the signal path $P_4$ of the frequency dividing circuit 317 to the quadrature modulator 310, so that the frequency-divided RF signal $S_{RF}''$ generated by the frequency divider 305 as the IF frequency $f_{IF}$. The switch $SW_3$ couples the signal path $P_6$ to the phase frequency detector 3205, and the frequency divider 3171 at the signal path $P_6$ frequency divides the IF signal $S_{IF}$ to generate the signal $S_{IF}'$, which is then transmitted to the phase frequency detector 3205. In other words, according to the third embodiment of the invention, selective frequency dividing elements are added to an IF carrier source terminal and output terminal of the quadrature modulator 310, so as to selectively frequency divide signals having different frequencies when the transmitting apparatus 300 operates at different bands.

Therefore, when the transmitting apparatus 300 operates at the GSM band, supposing the RF oscillation signal $S_{RF}$ generated by the RF oscillator RFVCO at the receiving terminal has a frequency of 3840 MHz, the frequency divider 305 and the frequency dividing circuit 307 equivalently frequency divide the RF oscillation signal $S_{RF}$ by 64, so as to generate the signal $S_{div1}$ having a frequency of 60 MHz. That is, the IF frequency $f_{IF}$ is 60 MHz, and the corner frequency of frequency resonance of the IF filter 315 is around 60 MHz to remove high-frequency harmonic noises to generate the IF signal $S_{IF}$. At this point, the switch $SW_3$ couples the signal path $P_5$ of the frequency dividing circuit 317 between the IF filter 315 and the phase frequency detector 3205. Accordingly, the signal path $P_5$ directly forwards the IF signal $S_{IF}$ to the phase frequency detector 3205 but does not frequency divide the IF signal $S_{IF}$. When the transmitting apparatus 300 operates at the DCS band, supposing the RF oscillation signal $S_{RF}$ generated by the RF oscillator RFVCO at the receiving terminal has a frequency of 3840 MHz, the frequency divider 305 frequency divides the RF oscillation signal $S_{RF}$ by 32 and the frequency dividing circuit 307 does not frequency divide the RF oscillation signal $S_{RF}$, so that the signal outputted by the frequency dividing circuit 307 has a frequency of 120 MHz. In other words, the IF frequency $f_{IF}$ is 120 MHz, and the corner frequency of frequency resonance of the IF filter 315 is around 120 MHz to remove high-frequency harmonic noises to generate the IF signal $S_{IF}$. At this point, the switch $SW_3$ couples the signal path $P_6$ of the frequency dividing circuit 317 between the IF filter 315 and the phase frequency detector 3205. The frequency divider 3171 at the signal path $P_6$ then frequency divides the IF signal $S_{IF}$ by a divisor $P_{3171}$, which is 2 in this embodiment, to output a signal having a frequency of 60 MHz from the frequency dividing circuit 317. Therefore, whether the transmitting apparatus 300 operates at the GSM band or the DCS band, the phase frequency detector 3205 in this embodiment merely needs to process signals having a predetermined frequency, i.e., 60 MHz, while the divisors of the frequency dividers 3220 and 3225 are constants. Thus, a circuit design of the OPLL 320 is made easier to realize. Further, the divisors of the frequency dividers 305, 3071 and 3171 are also designed as constants to again make the overall circuit design easier to realize.

It is to be noted that, the divisors of the various frequency dividers and the frequency of the IF signal are for illustrative purposes but not to limit the invention thereto. Other frequencies used as examples are also application approaches of the invention—applications of other frequency values shall be included in the scope of the invention.

Figure 4:
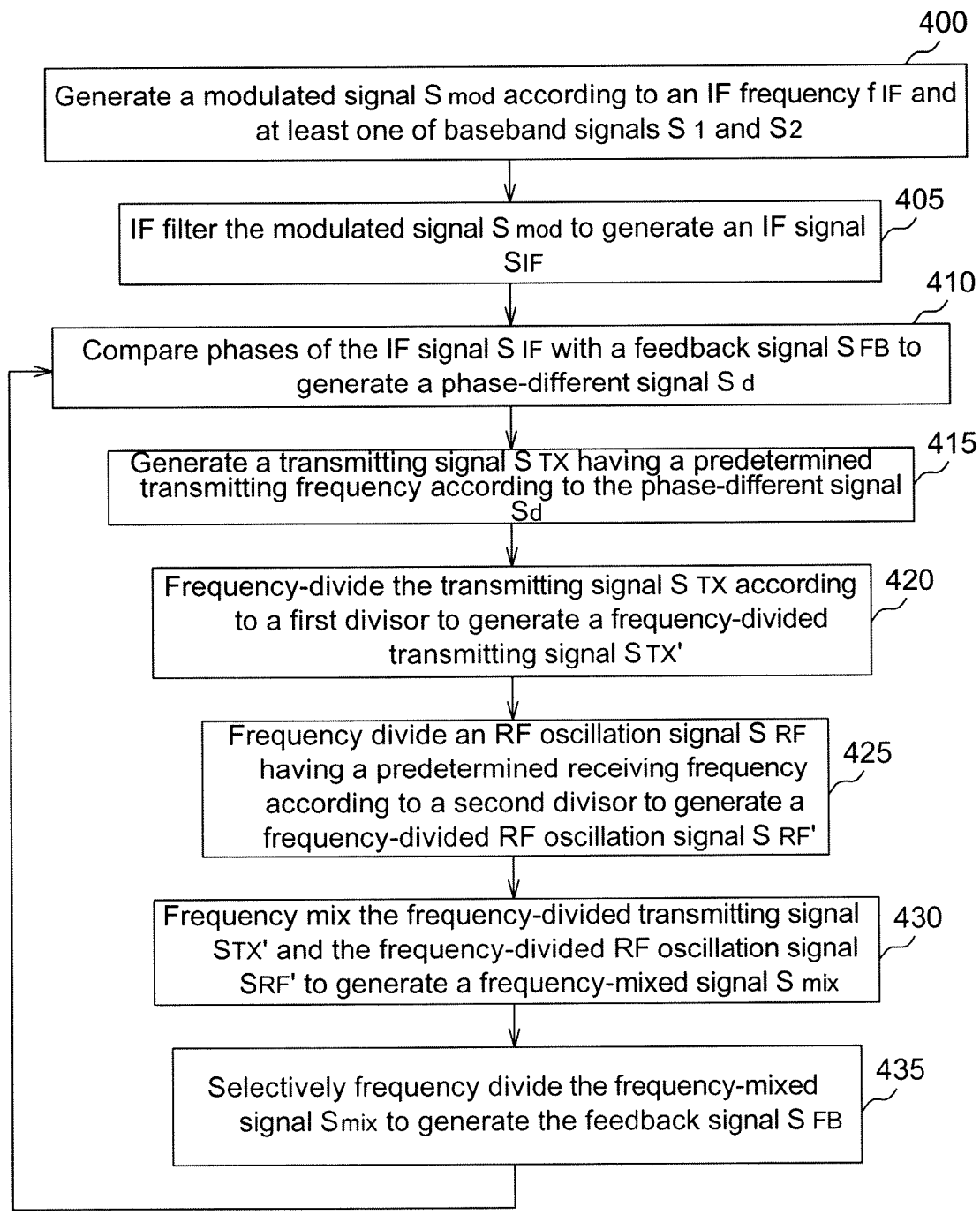
FIG. 4 is a flowchart for operating the transmitting apparatus shown in FIG. 1.
Figure 5:
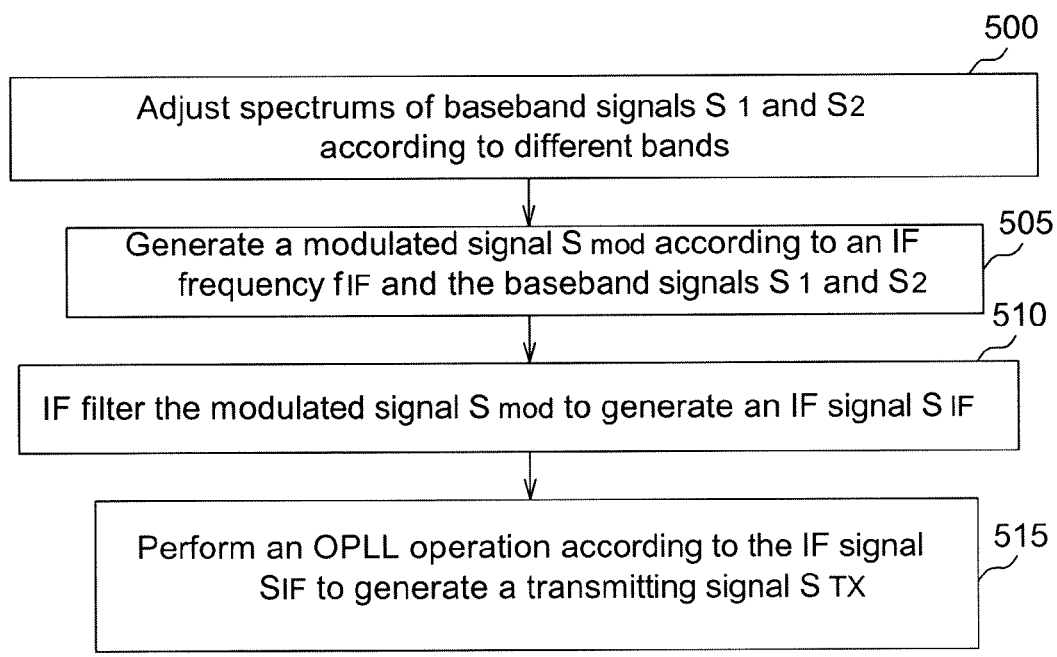
FIG. 5 is a flowchart for operating the transmitting apparatus shown in FIG. 2.
Figure 6:
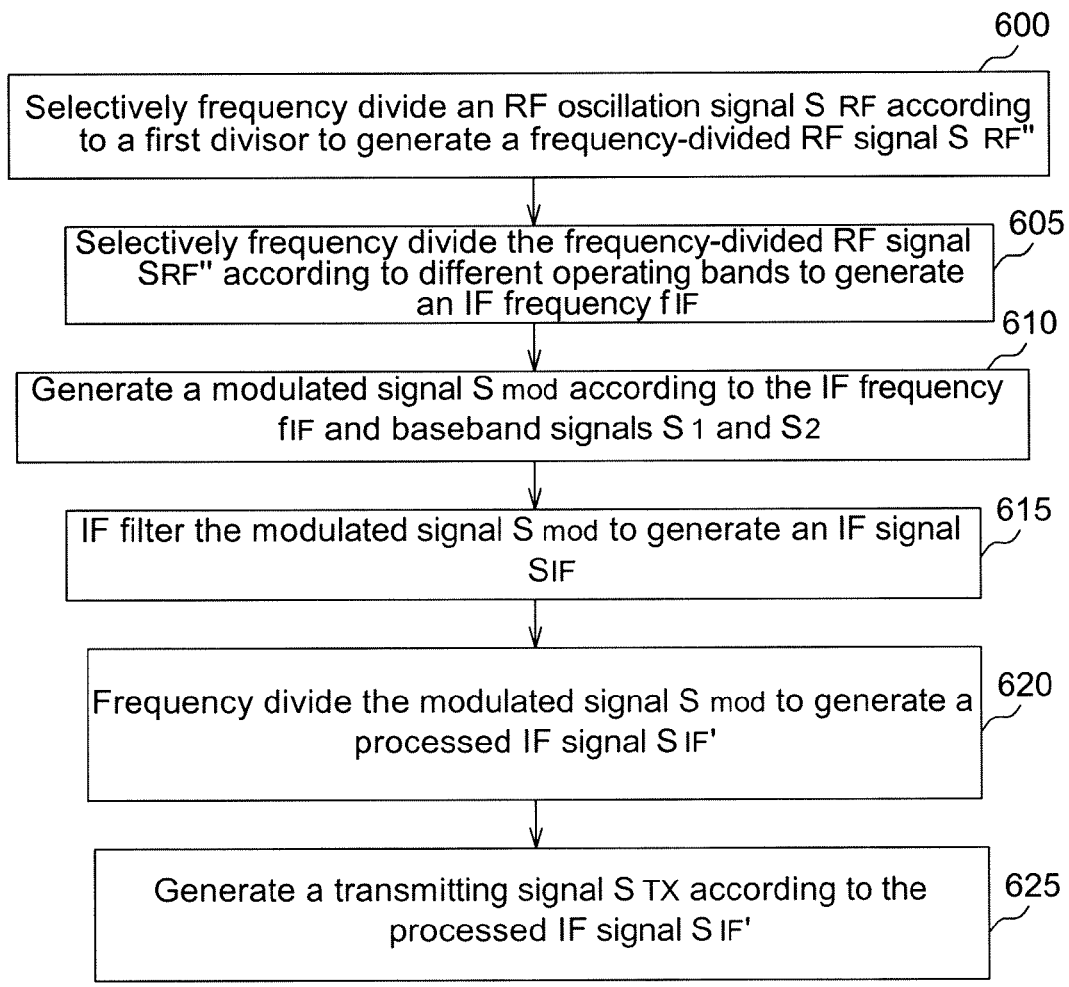
FIG. 6 is a flowchart for operating the transmitting apparatus shown in FIG. 3.

FIGS. 4 to 6 shows flowcharts for operating the transmitting apparatus depicted in FIGS. 1 to 3. Provided that substantially the same effects are achieved, the steps in FIGS. 4 to 6 need not be performed as sequences shown nor be performed successively but may be interleaved by other steps. Details of FIG. 4 shall be given below. In Step 400, a modulated signal $S_{mod}$ is generated according to an IF frequency $f_{IF}$ and at least one of baseband signals $S_1$ and $S_2$. In Step 405, the modulated signal $S_{mod}$ is IF filtered to generate an IF signal $S_{IF}$. In Step 410, phases of the IF signal $S_{IF}$ and a feedback signal $S_{FB}$ are compared to generate a phase-different signal $S_d$. In Step 415, a transmitting signal $S_{TX}$ having a predetermined transmitting frequency is generated according to the phase-different signal $S_d$. In Step 420, the transmitting signal $S_{TX}$ is frequency-divided according to a first divisor to generate a frequency-divided transmitting signal $S_{TX}'$. In Step 425, an RF oscillation signal $S_{RF}$ having a predetermined receiving frequency is frequency divided according to a second divisor to generate a frequency-divided RF oscillation signal $S_{RF}'$. In Step 430, the frequency-divided transmitting signal $S_{TX}'$ and the frequency-divided RF oscillation signal $S_{RF}'$ are frequency mixed to generate a frequency-mixed signal $S_{mix}$. In Step 435, the frequency-mixed signal $S_{mix}$ is selectively frequency divided to generate the feedback signal $S_{FB}$.

Details of FIG. 5 shall be given below. In Step 500, spectrums of baseband signals $S_1$ and $S_2$ are adjusted according to different bands at which the transmitting apparatus operates. In Step 505, a modulated signal $S_{mod}$ is generated according to an IF frequency $f_{IF}$ and the baseband signals $S_1$ and $S_2$. In Step 510, the modulated signal $S_{mod}$ is IF filtered to generate an IF signal $S_{IF}$. In Step 515, an OPLL operation is performed according to the IF signal $S_{IF}$ to generate a transmitting signal $S_{TX}$ having a predetermined transmitting frequency, wherein a divisor of at least one frequency dividing of the OPLL operation is a constant.

Details of FIG. 6 shall be given below. In Step 600, an RF oscillation signal $S_{RF}$ having a predetermined RF receiving frequency is selectively frequency divided according to a first divisor to generate a frequency-divided RF signal $S_{RF}''$. In Step 605, the frequency-divided RF signal $S_{RF}''$ is selectively frequency divided according to different operating bands to generate an IF frequency $f_{IF}$. In Step 610, a modulated signal $S_{mod}$ is generated according to the IF frequency $f_{IF}$ and baseband signals $S_1$ and $S_2$. In Step 615, the modulated signal $S_{mod}$ is IF filtered to generate an IF signal $S_{IF}$. In Step 620, the modulated signal $S_{mod}$ is frequency divided to generate a processed IF signal $S_{IF}'$. In Step 625, a transmitting signal $S_{TX}$ is generated according to the processed IF signal $S_{IF}'$.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A transmitting apparatus operative in a plurality of bands, comprising:
    a modulator (110), for generating a modulated signal according to an intermediate frequency (IF) and a baseband signal;
    an IF filter (115), coupled to the modulator, for filtering the modulated signal to generate an IF signal;
    an offset phase-locked loop (OPLL) (120), coupled to the IF filter (115); and
    first (125*a*) and second (125*b*) frequency dividers coupled to an output of the OPLL (120),
    wherein the OPLL comprises a phase frequency detector (1205), for recceing an output of the IF filter (115), a loop filter (1210), for receiving an output of the phase frequency detector (1205), and a controllable oscillator (1215) coupled to the loop filter (1210) and configured to supply a transmitting signal to each of the first (125*a*) and second (125*b*) frequency dividers,
    wherein the OPLL further comprises a feedback circuit connected between an output of the controllable oscillator (1215) and the phase frequency divider (1205), the feedback circuit comprising an offset mixer (1230) having as inputs outputs, respectively, of a third (1220) frequency divider and a fourth (1225) frequency divider, wherein the third (1220) frequency divider is configured to receive the transmitting signal and the fourth (1225) frequency divider is configured to receive a local oscillator signal, and a frequency dividing circuit (1240), for receiving an output 3 from the offset mixer (1230) and for providing a feedback signal to the phase frequency detector (1205), the frequency dividing circuit (1240) having a switch selectable first path and second path, the first path including a fifth (12405) frequency divider and the second path configured to bypass the fifth frequency divider, and
    wherein divisors of the first-fifth frequency dividers are constants.

2. A transmitting apparatus operative in a plurality of bands, comprising:
    a modulator (310), for generating a modulated signal according to an intermediate frequency (IF) and a baseband signal;
    a first frequency divider (305), for receiving a local oscillator signal;
    a first frequency dividing circuit (307), for receiving an output of the first frequency divider, the first frequency dividing circuit (307) having a first switch selectable first path and second path, the first path including a second (3071) frequency divider and the second path configured to bypass the second (3071) frequency divider, wherein the IF is provided by the first frequency dividing circuit (307);
    an IF filter (315), coupled to the modulator, for filtering the modulated signal to generate an IF signal;
    a second frequency dividing circuit (317), for receiving an output of the IF filter (315), the second frequency dividing circuit having a second switch selectable first path and second path, the first path including a third (3171) frequency divider and the second path configured to bypass the second (3171) frequency divider;
    an offset phase-locked loop (OPLL) (320), for receiving an output of the second frequency dividing circuit; and
    fourth (125*a*) and fifth (125*b*) frequency dividers coupled to an output of the OPLL (320),
    wherein the OPLL comprises a phase frequency detector (3205), for receiving an output of the second frequency dividing circuit (317), a loop filter (3210), for receiving an output of the phase frequency detector (3205), and a controllable oscillator (3215) coupled to the loop filter (3210) and configured to supply a transmitting signal to each of the fourth (125*a*) and fifth (125*b*) frequency dividers,
    wherein the OPLL further comprises a feedback circuit connected between an output of the controllable oscillator (3215) and the phase frequency divider (3205), the feedback circuit comprising an offset mixer (3230) having as inputs outputs, respectively, of a sixth (3220) frequency divider and a seventh (3225) frequency divider, wherein the sixth (3220) frequency divider is configured to receive the transmitting signal and the seventh (3225) frequency divider is configured to receive the local oscillator signal, an output from the offset mixer (3230) providing a feedback signal to the phase frequency detector (3205), and
    wherein divisors of the first-seventh frequency dividers are constants.

* * * * *